United States Patent
Thoma et al.

(10) Patent No.: US 6,982,998 B2
(45) Date of Patent: Jan. 3, 2006

(54) LINEAR CAVITY TUNABLE LASER

(75) Inventors: Peter Thoma, Rottenburg (DE); Emmerich Mueller, Aidlingen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 155 days.

(21) Appl. No.: 10/074,135

(22) Filed: Feb. 12, 2002

(65) Prior Publication Data

US 2002/0172238 A1 Nov. 21, 2002

(30) Foreign Application Priority Data

May 15, 2001 (EP) .................................. 01111722

(51) Int. Cl.
*H01S 3/10* (2006.01)
*H01S 3/08* (2006.01)

(52) U.S. Cl. ............................ 372/20; 372/23; 372/98; 372/108

(58) Field of Classification Search ................. 372/20, 372/98, 18, 92, 108, 23, 99, 101, 107
See application file for complete search history.

(56) References Cited

U.S. PATENT DOCUMENTS 5,172,382 A * 12/1992 Loh et al. ..................... 372/26

5,263,037 A 11/1993 Trutna, Jr. et al. ............ 372/20

(Continued)

FOREIGN PATENT DOCUMENTS

EP 0 641 052 A1 3/1995

OTHER PUBLICATIONS

Jobst, B. Examiner. European Search Report Application No. EP 01 11 1722 dated Oct. 1, 2000.

(Continued)

*Primary Examiner*—Minsun Oh Harvey
*Assistant Examiner*—Armando Rodriguez

(57) ABSTRACT

A laser source includes a laser medium having a back facet and a front surface, whereby the laser medium is adapted to emit a laser beam through the front surface into an external cavity defined in length by a cavity end mirror reflecting the laser beam back towards the laser medium. A wavelength tunable filter is arranged between the laser medium and the cavity end mirror adapted for tuning the wavelength of the laser beam. The laser medium, the wavelength tunable filter, and the cavity end mirror are arranged in a spatially linear cavity structure substantially in a line without angular redirection of the laser beam in the cavity between the laser medium and the cavity end mirror. At least one portion of the laser beam within the cavity after passing the wavelength tunable filter and before again passing the laser medium is coupled out as an output beam of the laser source, and the cavity end mirror is provided to be partly transparent for coupling out a first output beam.

12 Claims, 4 Drawing Sheets

U.S. PATENT DOCUMENTS

| | | | | |
|---|---|---|---|---|
| 5,266,803 A | * | 11/1993 | Heffelfinger | 250/582 |
| 5,272,708 A | * | 12/1993 | Esterowitz et al. | 372/20 |
| 5,412,673 A | | 5/1995 | Caprara et al. | 372/19 |
| 5,483,341 A | * | 1/1996 | Naganuma | 356/450 |
| 5,673,281 A | * | 9/1997 | Byer | 372/3 |
| 5,949,801 A | * | 9/1999 | Tayebati | 372/20 |
| 6,002,703 A | | 12/1999 | Hwu et al. | 372/92 |
| 6,081,539 A | * | 6/2000 | Mattori et al. | 372/20 |
| 6,108,355 A | * | 8/2000 | Zorabedian | 372/20 |
| 6,282,215 B1 | * | 8/2001 | Zorabedian et al. | 372/20 |
| 6,459,844 B1 | * | 10/2002 | Pan | 385/140 |
| 6,526,071 B1 | * | 2/2003 | Zorabedian et al. | 372/20 |
| 6,556,599 B1 | * | 4/2003 | Svilans | 372/20 |
| 2002/0126345 A1 | * | 9/2002 | Green et al. | 359/122 |

OTHER PUBLICATIONS

Kawaguchi H. et al., "A new class of instabilties in a diode laser with an external cavity," Applied Physics Letters, American Institue of Physics, New York, vol. 45, No. 9, pp. 934-936, XP000706952, Nov. 1, 1984.

Fuhrmann W. et al., "A Contiuously Tunable GaAs Diode Laser with an External Resonator," Applied Physics B. Photophysics and Chemistry, Springer Verlag, Heidelberg, Germany, vol. B49, No. 1, pp. 29-32, XP000034054, Jul. 1, 1989.

* cited by examiner

LINEAR CAVITY TUNABLE LASER

BACKGROUND OF THE INVENTION

The present invention relates to wavelength tunable laser sources.

Wavelength tunable laser sources are becoming increasingly important in industry. Typical designs for such tunable laser sources with external cavity are disclosed e.g. in EP-A-921614, EP-A-641052, U.S. Pat. No. 5,263,037, Fuhrmann W et al: "A Continuously Tunable GaAs Diode Laser with an External Resonator", Applied Physics B. Photophysics and Chemistry, Springer Verlag Heidelberg, vol.B49, no.1, 1 Jul. 1989, p.29–32, XP000034054, or Kawaguchi H et al: "A new class of instabilities in a diode laser with an external cavity", Applied Physics Letters, American Institute of Physics, New York, vol.45, no., 1 Nov. 1984, p.934–936, XP000706952, ISSN: 0003-6951.

SUMMARY OF THE INVENTION

It is an object of the present invention to provide an improved wavelength tunable laser source preferably fostering miniaturization. The object is solved by the independent claims. Preferred embodiments are shown by the dependent claims.

According to the present invention, a laser source is provided having a spatially linear cavity structure, so that all essential components within the lasing cavity can be arranged in a linear manner (i.e. substantially in a line without requiring angular designs). The laser source comprises a laser medium (e.g. a laser chip) having a back facet and a front surface, whereby the laser medium emits a beam through the front surface into an external cavity defined in length by a cavity end mirror. The laser medium preferably is a semiconductor laser medium. The cavity end mirror reflects the light signal back towards the laser medium, resulting in a resonance behavior in the cavity between the cavity end mirror and the back facet of the laser medium.

A wavelength tunable filter is arranged between the laser medium and the cavity end mirror. The presence of the wavelength tunable filter will allow resonance in the cavity only to such wavelengths or wavelength ranges as defined by its wavelength characteristic. Tuning the wavelength of the wavelength tunable filter thus allows controlling the wavelength(s) of the resonant beam(s) within the cavity.

In a first embodiment of the present invention, the cavity end mirror is provided to be partly transparent, preferably semi-transparent, so that a portion of the beam within the cavity will be coupled out, thus providing a first output of the linear laser cavity. The first output is characterized by high-wavelength purity and low source spontaneous emission (SSE) due to coupling out close to the transmission through the wavelength tunable filter and before being amplified again by the laser medium.

In another preferred embodiment the linear cavity laser further provides a second output derived from providing the back facet of the laser medium to be partly transparent. The second output is characterized by having higher optical power but also higher SSE and lower wavelength purity than the first output. However, by carefully designing the characteristic of the partly transparent cavity end mirror and/or the transparency characteristics of the back facet of the laser medium allows to provide two controlled outputs: one with lower power but higher wavelength purity, and the other with higher power but lower wavelength purity. The characteristics of both the cavity end mirror and the back facet should be carefully adjusted in order to yield in the desired laser characteristics.

In another embodiment of the present invention, a mode hop free lasing can be provided by synchronizing the wavelength selection provided by the wavelength tunable filter with the (effective) optical length of the cavity. The length of the cavity can be modified e.g. in that either one of the cavity end mirror or the laser medium (including the back facet), or both, is linearly moved in the (linear) direction of the laser beam within the cavity. A synchronizing unit preferably controls the wavelength setting of the wavelength tunable filter and the optical path length of the cavity. In case of a laser with continuous wavelength tuning capability, the synchronizing unit preferably controls the mode number to be kept constant over the tuning.

In one embodiment the output of the laser is monitored and applied to the synchronizing unit for synchronizing wavelengths and optical path lengths. In another embodiment, a predefined optical path length will be associated with each wavelength value selectable for the wavelength tunable filter. Carefully adjusting the optical path length to the selected wavelength allows to achieve substantially mode hop free laser output when sweeping through a range of wavelength values.

In a further embodiment, the cavity end mirror is provided with (substantially) hundred percent reflectivity towards the cavity. Instead of coupling out the low SSE first output beam from the cavity end mirror, a beam splitter is provided between the cavity end mirror and the tunable filter for coupling out the first output beam. Alternatively, a beam splitter can be provided between the tunable filter and the laser medium, so that light returning from the tunable filter towards the laser medium will be coupled out (as the first output beam). Although such designs 'depart' from the linear arrangement of components, it is to be understood that the linear arrangement is not a 'must' for all components but that this linear architecture allows the arrangement of the essential components laser medium, wavelength tunable filter, and cavity end mirror in a space reduced linear manner.

The cavity end mirror can be provided as planar mirror having at least two angular degrees of freedom for adjustment of the mirror. Adjustment can be provided either manually or by means of adequate actuators. The cavity end mirror can also be provided as a curved mirror, preferably together with a focussing optics, which is less sensitive to angular misalignment and easy to align with good cavity stability.

In one embodiment, the cavity end mirror is provided as a three-dimensional retro reflector, preferably as an open corner cube or a solid glass corner cube. In case that the front surface of the cavity end mirror is provided to be fully reflective, all surfaces of the three-dimensional retro reflector or solid glass corner cube are provided with 100% reflectivity. In case that the front surface of the cavity end mirror is provided to be partially reflective, at least one surface of the three-dimensional retro reflector has to be semitransparent.

The invention can be partly embodied or supported by one or more suitable software programs, which can be stored on or otherwise provided by any kind of data carrier, and which might be executed in or by any suitable data processing unit. In particular, control algorithms might be provided by hardware and/or software tools.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s).

DETAILED DESCRIPTION OF THE INVENTION

Figure 1:
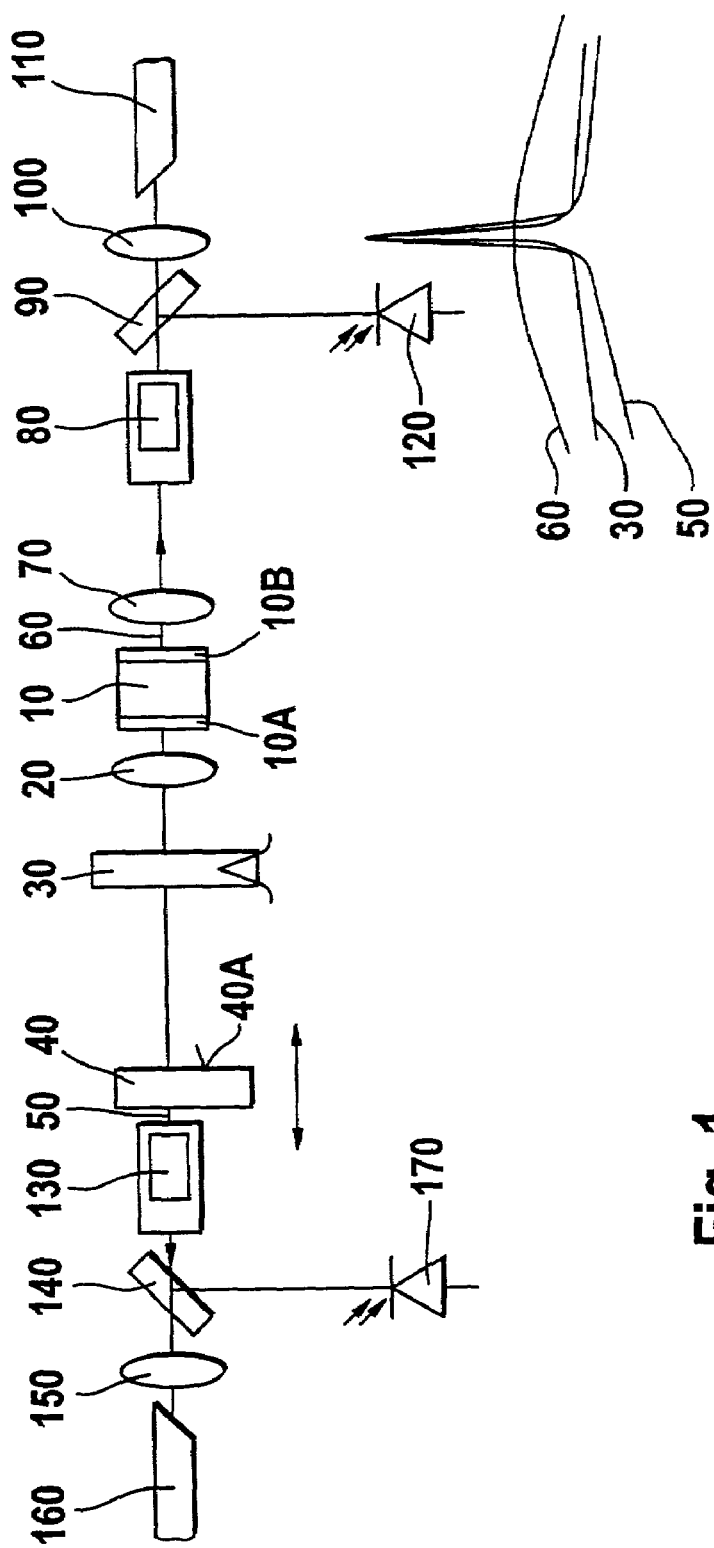
FIGS. 1–3 show preferred embodiments according to the present invention.

In FIG. 1, a laser medium 10, e.g., a semiconductor active laser gain medium, has a front surface 10A and a back facet 10 B. While the front surface 10A is preferably anti-reflection coated, the back facet is preferably provided with a high reflectivity (HR) coating. A laser beam leaving the laser medium 10 through the front surface 10A is passed through a lens 20 and a wavelength tunable filter 30 to a cavity end mirror 40 having a semitransparent front surface 40A. A portion of the laser beam is reflected by the front surface 40A back towards the wavelength tunable filter 30, while another portion is coupled out by the cavity end mirror 40 as a first output beam 50.

The optical path between the front surface 40A and the back facet 10B provides the cavity of the laser, whereby the optical path between the front surface 40A of the cavity end mirror 40 and the front surface 10A of the laser medium 10 represents an external cavity.

Another portion of the laser beam within the cavity can be coupled out at the back facet 10B as a second output 60. The second output signal 60 is preferably launched through a lens 70, an isolator 80, and a beam splitter 90 and might be coupled by a lens 100 into a fiber 110. A portion of the second output beam 60 can be coupled out by the beam splitter 90 and directed to a detector 120 for monitoring the second output.

In accordance with the above described coupling out of the second output beam 60, the first output signal 50 is also preferably launched through an isolator 130, a beam splitter 140, and a lens 150 to a fiber 160. The beam coupled out from the beam splitter 140 can be directed to a detector 170 for monitoring the first output beam 50.

The wavelength tunable filter 30 in the cavity provides a wavelength filtering to the laser beam within the cavity, so that only such laser modes can build up that are not filtered out by the wavelength tunable filter 30. Controlling the wavelength (range) of the tunable filter 30 thus allows selecting the desired wavelength or wavelength range for the outputs 50 and 60.

The wavelength tunable filter 30 preferably is a tunable Fabry Perot filter or an acousto-optic tunable filter.

It is to be understood that the essential laser setup of the embodiment of FIG. 1 only comprises the laser medium 10 having a partially transparent back facet 10B, the wavelength tunable filter 30, and the cavity end mirror 40 having a partially transparent front surface 40A. All further components are optional dependent on the specific application and requirements. In particular, the isolators 130 and 80 are provided to decouple the cavity from external light signals, in particular light signals reflected from the beams 50 and 60, so that the cavity will not be disturbed from external. This, however, is not essential for the present invention and can be omitted or solved otherwise. The lenses 150 and 100 are provided to couple the output beams 50 and 60 in the respective fibers 160 and 110, however, other coupling methods and light paths (than the fibers 160 and 110) can be provided accordingly. The beam splitters 140 and 90 together with the monitors 170 and 120 are optionally provided to monitor the respective output beams 50 and 60. The lens 20 is preferably provided to generate a collimated beam to achieve high resonator finesse (good quality) at the cavity side, while the lens 70 is preferably provided to generate a collimated beam to launch the optical power through further components such as isolator and/or beam splitter at the output side.

From FIG. 1 it becomes apparent that all essential cavity components can be arranged in a spatially linear manor, or, in other words, in a line of components without requiring to direct or redirect the light beam in angles (others than 180°) as required for example when employing a Littman or Littrow architecture. This allows to significantly reducing the cavity in size rendering it subject to further miniaturization.

The first output signal 50 provides a high-purity signal with respect to wavelength purity and signal-to-noise ratio, since it is coupled out directly behind the wavelength tunable filter 30 and before returning into the laser medium 10 and being amplified again. The second output signal 60, in contrast thereto, provides a high power output at a significantly higher potential output power than the first output signal 50 but also with higher source spontaneous emission (SSE).

Instead of coupling out both, the first and the second output 50 and 60, the back facet 10B can be provided to be fully reflective so that no light is coupled out to the second output 60. In that case the first output signal 50 represents the only output of the linear cavity laser setup.

On the right hand side in FIG. 1, typical spectral shapes are shown for the first and the second output 50 and 60 and of the tunable filter 30. However, the intensity scale for both outputs is different, with the intensity of the first output being significantly smaller than the intensity of the second output 60.

Figure 2:
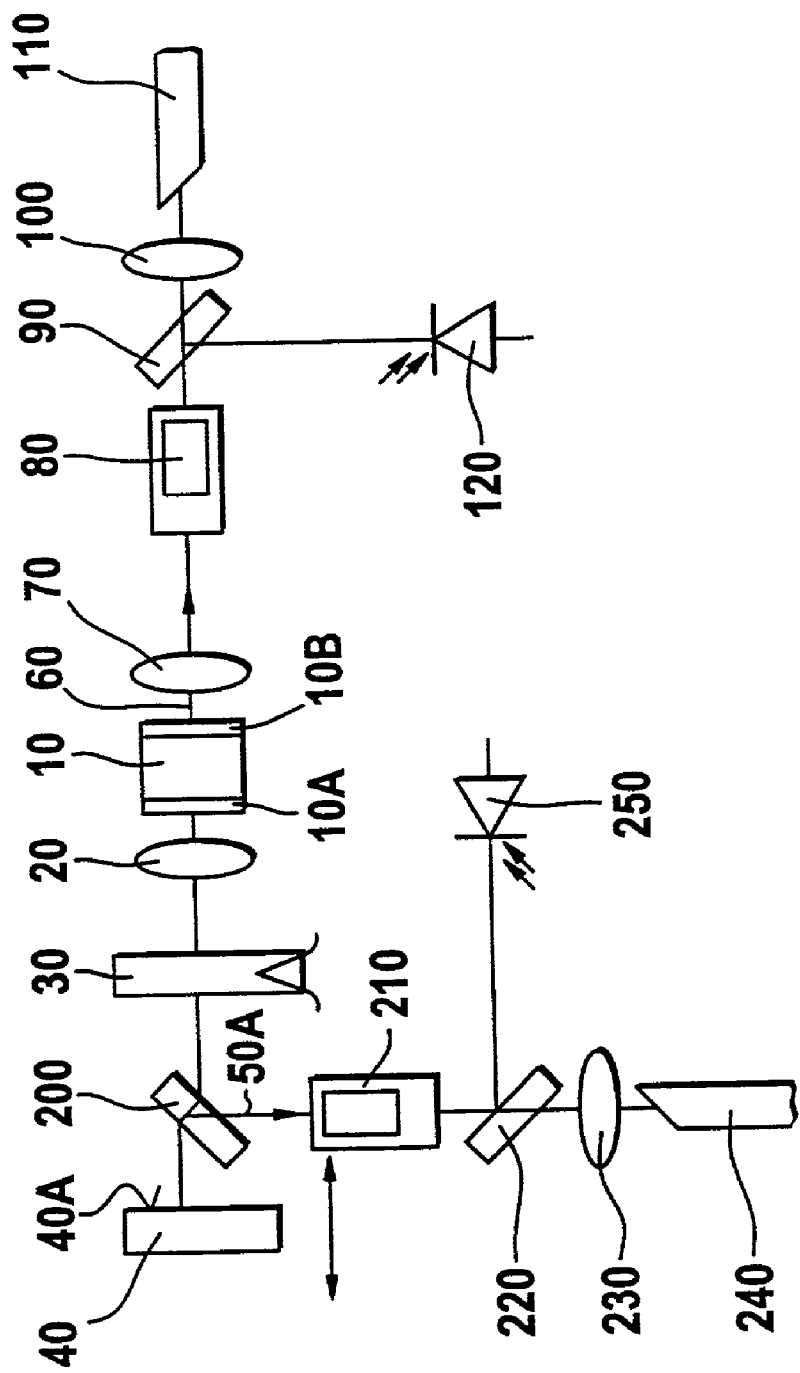

FIG. 2 shows another preferred embodiment. Instead of coupling out the first output beam 50 by means of the front surface 40A of the cavity end mirror 40, the front surface 40A in the embodiment of FIG. 2 is provided to be fully reflective, and a beam splitter 200 is arranged between the cavity end mirror 40 and the wavelength tunable filter 30. The first output beam 50A is derived from the beam splitter 200 and coupled out in accordance with the embodiment of FIG. 1. In this embodiment, the essential cavity features are still arranged in a linear manner, and only the output beam 50A is redirected from that linear arrangement. The embodiment of FIG. 1 is mechanically easier in case that the cavity end mirror 40 is provided to be movable (as will be explained below).

In accordance with the above described, the first output signal 50A can also be launched through an isolator 210, a beam splitter 220, and a lens 230 to a fiber 240. The beam coupled out from the beam splitter 220 can be directed to a detector 250 for monitoring the first output beam 50A.

Alternatively but not shown in FIG. 2, the beam splitter can also be provided between the tunable filter 30 and the laser medium 10 (but before the lens 20), so that light returning from the tunable filter 30 towards the laser medium 10 will be coupled out (as the first output beam 50A).

Figure 3:
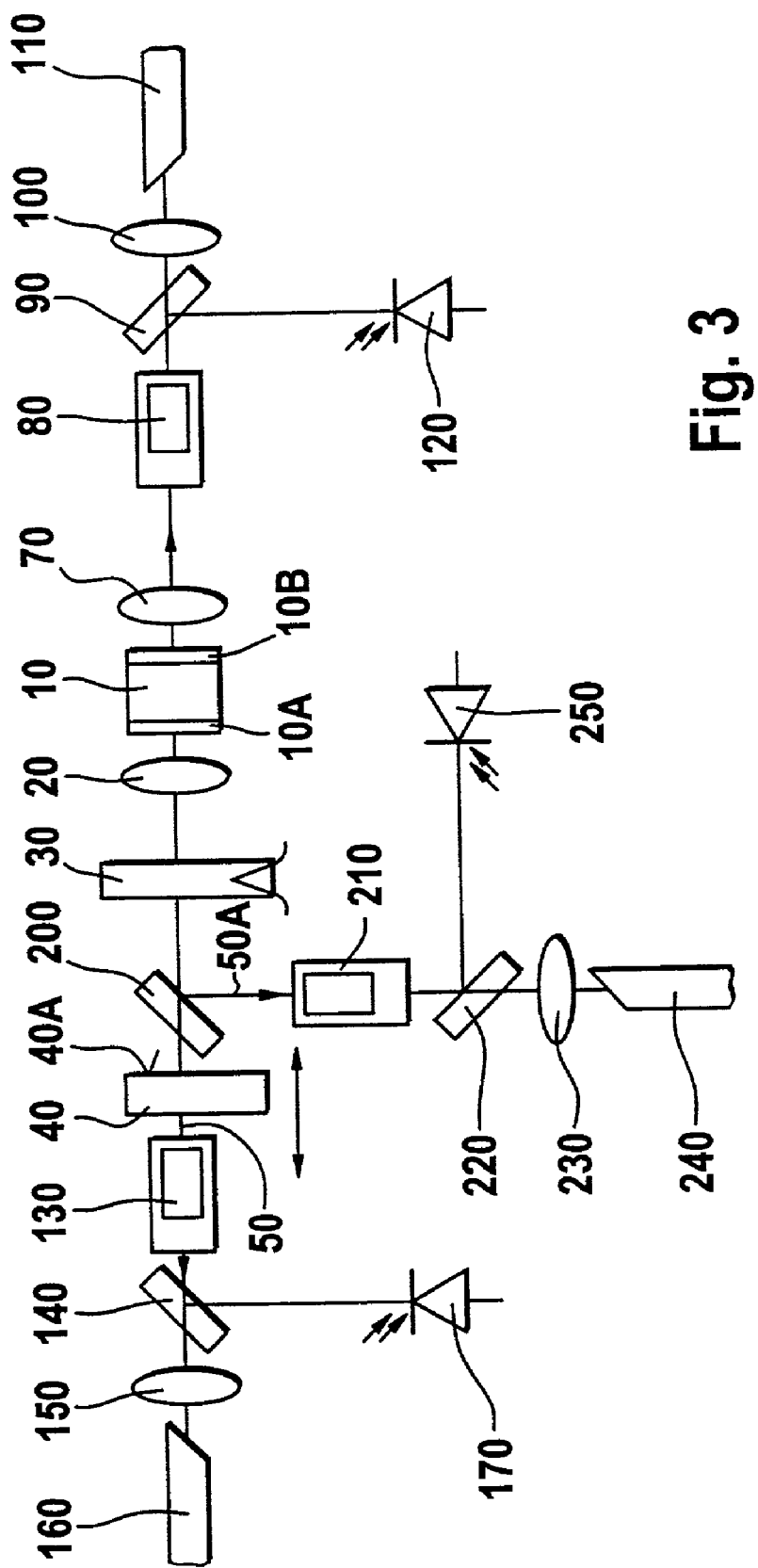

FIG. 3 shows a combined approach from the embodiments of FIGS. 1 and 2. The front surface 40A of the cavity end mirror 40 is provided to be partially transparent emitting the first output beam 50 as in FIG. 1. The beam splitter 200 couples out a portion of the cavity laser signal as the output beam 50A as in FIG. 2. Thus, a third output can be provided, e.g. for monitoring purposes.

In a preferred embodiment, as indicated in all embodiments of FIGS. 1–3, the cavity end mirror 40 is provided to be adjustable in the direction of the cavity length (as indicated by the arrow underneath the cavity end mirror 40). This allows to adjust the optical path length of the laser cavity (between the back facet 10B and the front surface 40A) in order to provide mode hop free laser tuning when modifying the wavelength of the wavelength tunable filter 30.

In a preferred embodiment (not shown in Figures), the cavity end mirror 40 is adjustable in the direction of the cavity length by means of a translation stage. This can be accomplished e.g. by Piezo stack or a spindle driven slider with a guiding mechanism.

In another preferred embodiment, the adjustment of the cavity length by moving the cavity end mirror 40 as well as the wavelength tuning of the wavelength tunable filter 30 are controlled and synchronized by a controller (not shown in the Figures).

Instead of, or in combination with, moving the cavity end mirror 40, the back facet 10B of the laser medium 10 can be moved, e.g. by moving the laser medium 10.

Figure 4:
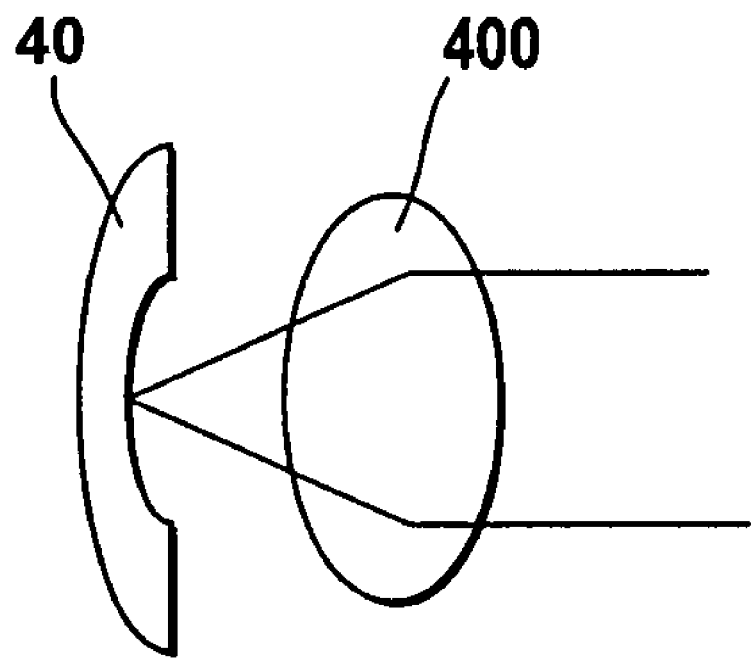
FIG. 4 shows a preferred embodiment for the cavity end mirror 30.

FIG. 4 shows a preferred embodiment of the cavity end mirror 40. Instead of the cavity end mirror 40 being a planar mirror, it can be a curved mirror, preferably together with a focussing optics 400. The focal length of the focussing optics 400, e.g. a lens, should be matched to the mirror curve radius.

In a further embodiment, the cavity end mirror 40 is a three-dimensional retro reflector (trihedral prism), preferably an open corner cube or a solid glass corner cube e.g. a corner cube prism U43 as provided by Edmund Industrie Optic GmbH. In case of the embodiment of FIG. 2, wherein the front surface 40A is provided to be fully reflective, all surfaces of the three-dimensional retro reflector or solid glass corner cube are provided with 100% reflectivity. In case of the embodiments of FIG. 1 or 3, at least one surface of the three-dimensional retro reflector has to be semitransparent.

In case that the cavity end mirror 40 is provided by a plane mirror, there are at least two angular degrees of freedom for adjustment of the mirror. Adjustment can be provided either manually or by means of adequate actuators. Adjusting collimating lenses in x or y direction could also be applied instead of the two angular degrees of freedom. The collimated beam should preferably hit the end mirror perpendicular.

What is claimed is:

1. A laser source comprising:
   a laser medium having a back facet and a front surface, wherein said laser medium emits a laser beam through said front surface into an external cavity;
   a cavity end mirror that defines a length of said external cavity and reflects said laser beam back towards said laser medium, wherein said cavity end mirror is curved;
   a wavelength tunable filter arranged between said laser medium and said cavity end mirror and being tunable to a wavelength of said laser beam to provide a resonant beam within said external cavity;
   a focussing optics that focuses said laser beam on said cavity end mirror,
   wherein said laser medium, said wavelength tunable filter, said focussing optics and said cavity end mirror are arranged in a spatially linear cavity structure substantially in a line without angular redirection of said laser beam in said external cavity, and
   wherein at least one of said laser medium or said cavity end mirror is movable in a linear direction of said spatially linear cavity structure to adjust an optical oath length of said external cavity commensurate with a tuning of said wavelength by said wavelength tunable filter.

2. The laser source of claim 1, further comprising a beam splitter between said wavelength tunable filter and said laser medium that couples out a portion of said resonant beam.

3. The laser source of claim 1, wherein said back facet of said laser medium is partly transparent and couples out a portion of said resonant beam.

4. The laser source of claim 1, further comprising a synchronizing unit that synchronizes said optical path length with said tuning of said wavelength by said wavelength tunable filter so that said laser beam is substantially mode hop free during said tuning.

5. The laser source of claim 1, wherein said cavity end mirror is partly transparent that couples out a portion of said resonant beam.

6. The laser source of claim 1, further comprising a beam splitter between said wavelength tunable filter and said cavity end mirror that couples out a portion of said resonant beam.

7. A laser source comprising:
   a laser medium that emits a laser beam into a cavity;
   a curved mirror, at an end of said cavity, that reflects said laser beam back towards said laser medium;
   a lens that focuses said laser beam onto said curved mirror; and
   a filter, between said laser medium and said curved mirror, being tunable to a wavelength of said laser beam to provide a resonant beam within said cavity,
   wherein said filter, said lens and said curved mirror are linearly situated in a path of said laser beam, and
   wherein at least one of said laser medium or said curved mirror is movable to adjust a length of said path commensurate with a tuning of said filter.

8. The laser source of claim 7, wherein said curved mirror is partly transparent and couples out a portion of said resonant beam.

9. The laser source of claim 7, wherein said laser medium has a partly transparent back facet that couples out a portion of said resonant beam.

10. The laser source of claim 7, further comprising a beam splitter, between said filter and said laser medium, that couples out a portion of said resonant beam.

11. The laser source of claim 7, further comprising a beam splitter, between said filter and said curved mirror, that couples out a portion of said resonant beam.

12. The laser source of claim 7, further comprising a device that synchronizes an adjustment of said length with said tuning of said filter.

* * * * *